US012787440B2

(12) United States Patent
Xie

(10) Patent No.: US 12,787,440 B2
(45) Date of Patent: Nov. 3, 2026

(54) DRIVING PANEL AND DISPLAY DEVICE

(71) Applicant: Xiamen Extremely PQ Display Technology Co., Ltd., Xiamen (CN)

(72) Inventor: Xiangwei Xie, Xiamen (CN)

(73) Assignee: Xiamen Extremely PQ Display Technology Co., Ltd., Xiamen (CN)

( * ) Notice: Subject to any disclaimer, the term of this patent is extended or adjusted under 35 U.S.C. 154(b) by 396 days.

(21) Appl. No.: 18/389,904

(22) Filed: Dec. 20, 2023

(65) Prior Publication Data

US 2024/0170499 A1 May 23, 2024

Related U.S. Application Data

(63) Continuation of application No. PCT/CN2021/142106, filed on Dec. 28, 2021.

(51) Int. Cl.
*H10D 86/60* (2025.01)
*G09G 3/32* (2016.01)
*H10D 86/40* (2025.01)
*H10W 90/00* (2026.01)

(52) U.S. Cl.
CPC ............... *H10D 86/60* (2025.01); *G09G 3/32* (2013.01); *H10D 86/411* (2025.01); *H10D 86/441* (2025.01); *H10W 90/00* (2026.01); *G09G 2300/0426* (2013.01); *G09G 2300/06* (2013.01); *G09G 2310/0267* (2013.01)

(58) Field of Classification Search
CPC .... H10D 86/60; H10D 86/411; H10D 86/441; G09G 3/3216; G09G 2300/0426
See application file for complete search history.

(56) References Cited

U.S. PATENT DOCUMENTS

| | | | | |
|---|---|---|---|---|
| 2017/0069280 | A1* | 3/2017 | Xu | G09G 3/20 |
| 2019/0043844 | A1 | 2/2019 | Liu et al. | |
| 2019/0333901 | A1* | 10/2019 | Cok | H10P 72/74 |
| 2020/0251539 | A1* | 8/2020 | Fu | H10K 59/352 |

(Continued)

FOREIGN PATENT DOCUMENTS

| | | |
|---|---|---|
| CN | 110148606 A | 8/2019 |
| CN | 110998847 | 4/2020 |

(Continued)

*Primary Examiner* — Leonard Chang
*Assistant Examiner* — Dzung T Hoang
(74) *Attorney, Agent, or Firm* — Zhigang Ma

(57) ABSTRACT

Provided are a driving panel and a display device including the driving panel. The driving panel includes: a substrate, including a display area and a non-display area; column scanning lines, disposed in the display area; row scanning lines, disposed in the display area and staggered with the column scanning lines; signal connecting lines, disposed in the display area and electrically connected to the row scanning lines; a drive circuit, disposed in the non-display area and electrically connected to the column scanning lines and the signal connecting lines; first electrode pads, disposed in the display area and electrically connected to the column scanning lines; second electrode pads, disposed in the display area and electrically connected to the row scanning lines and the signal connecting lines. Compared with the existing driving panel, the driving panel realizes a narrow border or even a borderless panel, and expands the application of the driving panel.

17 Claims, 4 Drawing Sheets

(56) References Cited

U.S. PATENT DOCUMENTS

| | | | | |
|---|---|---|---|---|
| 2020/0335030 | A1* | 10/2020 | Huang | H10W 90/00 |
| 2020/0343271 | A1 | 10/2020 | Kao et al. | |
| 2021/0183833 | A1* | 6/2021 | Hu | H10H 20/857 |
| 2021/0287606 | A1* | 9/2021 | Jo | G09G 3/3233 |

FOREIGN PATENT DOCUMENTS

| | | | |
|---|---|---|---|
| CN | 111584579 | A | 8/2020 |
| CN | 111797668 | A | 10/2020 |
| CN | 112216712 | A | 1/2021 |
| CN | 112673412 | A | 4/2021 |
| CN | 113764474 | A | 12/2021 |

* cited by examiner

DRIVING PANEL AND DISPLAY DEVICE

CROSS-REFERENCE TO RELATED APPLICATION

This application is a continuation of International Application No. PCT/CN2021/142106 filed on Dec. 28, 2021, which is herein incorporated by reference in its entirety.

TECHNICAL FIELD

The present disclosure relates to the field of display technologies, and particularly to a driving panel and a display device.

DESCRIPTION OF RELATED ART

With the development of micro light emitting diode (micro-LED) display, borderless display driving manner has become a design bright spot and even a design trend in a future market. At present, a bonding connection of a passive driving panel is achieved by a wiring (also referred to as left and right wiring) from left and right borders in a non-display area of the driving panel to a lower border of the driving panel and then to a drive circuit, thereby making the driving panel to have a narrow border. Since a signal current of a common driver is relatively large, a line width of a signal connecting line should be considered, therefore, a larger border is occupied by the line width of the signal connecting line and the left and right wiring. Therefore, the realization of borderless display driving manner is a technical problem to be solved.

SUMMARY

In view of the above, in order to overcome at least some of defects and deficiencies in the related art, embodiments of the present disclosure provide a driving panel and a display device, which solves the problem of a wider border of the driving panel in the related art, realizes a narrow-border or even borderless panel, and expands an market application of the driving panel.

An embodiment of the present disclosure provides a driving panel. The driving panel includes: a substrate, including a display area and a non-display area; column scanning lines, disposed in the display area of the substrate; row scanning lines, disposed in the display area of the substrate and staggered with the column scanning lines; signal connecting lines, disposed in the display area of the substrate and electrically connected to the row scanning lines; a drive circuit, disposed in the non-display area of the substrate and electrically connected to the column scanning lines and the signal connecting lines; first electrode pads, disposed in the display area of the substrate and electrically connected to the column scanning lines; and second electrode pads, disposed in the display area of the substrate and electrically connected to the row scanning lines and the signal connecting lines.

In an embodiment of the present disclosure, the driving panel further includes a first insulating layer, the first insulating layer covers the row scanning lines and disposed between the row scanning lines and the signal connecting lines, the first insulating layer is provided with first vias, and the row scanning lines are electrically connected to the signal connecting lines through the first vias.

In an embodiment of the present disclosure, the driving panel further includes a second insulating layer, the second insulating layer covers the signal connecting lines and the first insulating layer; the second insulating layer is disposed between the second electrode pads and the signal connecting lines, and also disposed between the first insulating layer and the column scanning lines; and the second insulating layer is provided with second vias, and the second electrode pads are electrically connected to the signal connecting lines through the second vias.

In an embodiment of the present disclosure, the driving panel further includes a planarization layer, the planarization layer covers the second insulating layer and the column scanning lines, and the first electrode pads penetrate through the planarization layer and are electrically connected to the column scanning lines.

In an embodiment of the present disclosure, each of the first electrode pads has a first binding surface, and each of the second electrode pads has a second binding surface; the first binding surface and the second binding surface are individually disposed at a side of the planarization layer facing away from the substrate, and a minimum distance between the first binding surface and the substrate is equal to a minimum distance between the second binding surface and the substrate.

In an embodiment of the present disclosure, the column scanning lines are in parallel with the signal connecting lines, and the column scanning lines and the signal connecting lines are perpendicular to the row scanning lines.

Further, an embodiment of the present disclosure provides a display device. The display device includes: any one of the driving panels as described above; and light emitting devices, disposed on the driving panel, where the light emitting devices include first electrodes and second electrodes, the first electrodes are electrically connected to the first electrode pads of the driving panel, and the second electrodes are electrically connected to the second electrode pads of the driving panel.

In an embodiment of the present disclosure, the row scanning lines and the column scanning lines are staggered with each other to form pixel units therebetween; the light emitting devices are disposed in the pixel units and form sub-pixels; and a projection area of each of the first vias on the substrate is equal to a projection area of at least one of each of the sub-pixels on the substrate.

In an embodiment of the present disclosure, each of the light emitting devices is a micron light emitting diode (micro-LED) or a submillimeter LED (mini-LED).

In an embodiment of the present disclosure, the display device further includes an encapsulation layer covering the light emitting devices and the driving panel.

As can be seen from the above, the embodiments of the present disclosure can realize a narrow or even borderless design of a driving panel based on a passive driving mode by arranging signal connecting lines connecting the row scanning lines in a display area of the driving panel, thereby meeting the requirements of users in the market for narrow borders. In addition, the signal connecting lines are connected to the row scanning lines through each via with a projection area equal to or larger than that of at least one corresponding pixel, so that a current carrying capacity of the signal connecting lines are improved and the reliability of the driving panel is improved. Under the protection of an organic film on the driving panel, the signal connecting lines can be electrically connected to light emitting devices through upper metal pads (first electrode pads and a second electrode pad) on the driving panel. Furthermore, by arranging a planarization layer, the bonding between the upper metal pads and the light emitting devices is facilitated, and the quality and reliability of the driving panel are improved.

BRIEF DESCRIPTION OF DRAWINGS

In order to explain technical solutions of embodiments of the present disclosure more clearly, accompanying drawings that required to be used in the embodiments will be briefly introduced hereinafter. Apparently, the accompanying drawings in the following description are merely some embodiments of the present disclosure. For those skilled in the art, other drawings can be obtained according to these accompanying drawings without any creative effort.

DETAILED DESCRIPTION OF EMBODIMENTS

In order to make objectives, technical solutions, and advantages of the embodiments of the present disclosure more clearly, the technical solutions in the embodiments of the present disclosure will be described clearly and completely in combination with the accompanying drawings. Apparently, the described embodiments are merely parts of the embodiments of the present disclosure, but not the whole embodiments. Based on the embodiments described in the present disclosure, all other embodiments obtained by those skilled in the art without creative work belong to the scope of protection of the present disclosure.

It should be noted that all directional indications (such as upper, lower, left, right, front, back, top, and bottom) in the embodiments of the present disclosure are merely used to explain relative positional relationships, and movement situations between components in a certain posture (as shown in the accompanying drawings), and if the certain posture changes, the directional indications will also change accordingly. In addition, the term "perpendicular" in the embodiments and claims means that an included angle between two elements is 90° or there is a deviation of −5°~+5°, and the term "parallel" means that an included angle between two elements is 0° or there is a deviation of −5°~+5°.

In the embodiments of the present disclosure, descriptions involving "first" and "second" are merely only used for descriptive purposes, and cannot be understood as indicating or implying their relative importance or implicitly indicating the number of indicated technical features. Therefore, the features defined by "first" and "second" can explicitly or implicitly include at least one feature.

Figure 1:
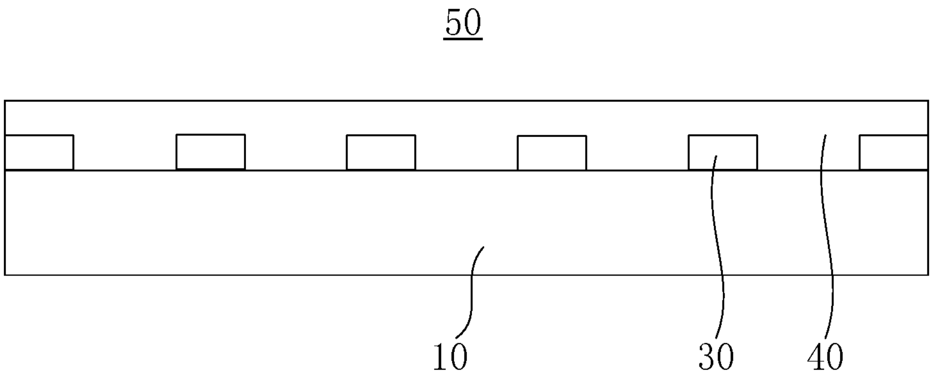
FIG. 1 illustrates a schematic cross-sectional view of a display device according to an embodiment of the present disclosure.
Figure 2:
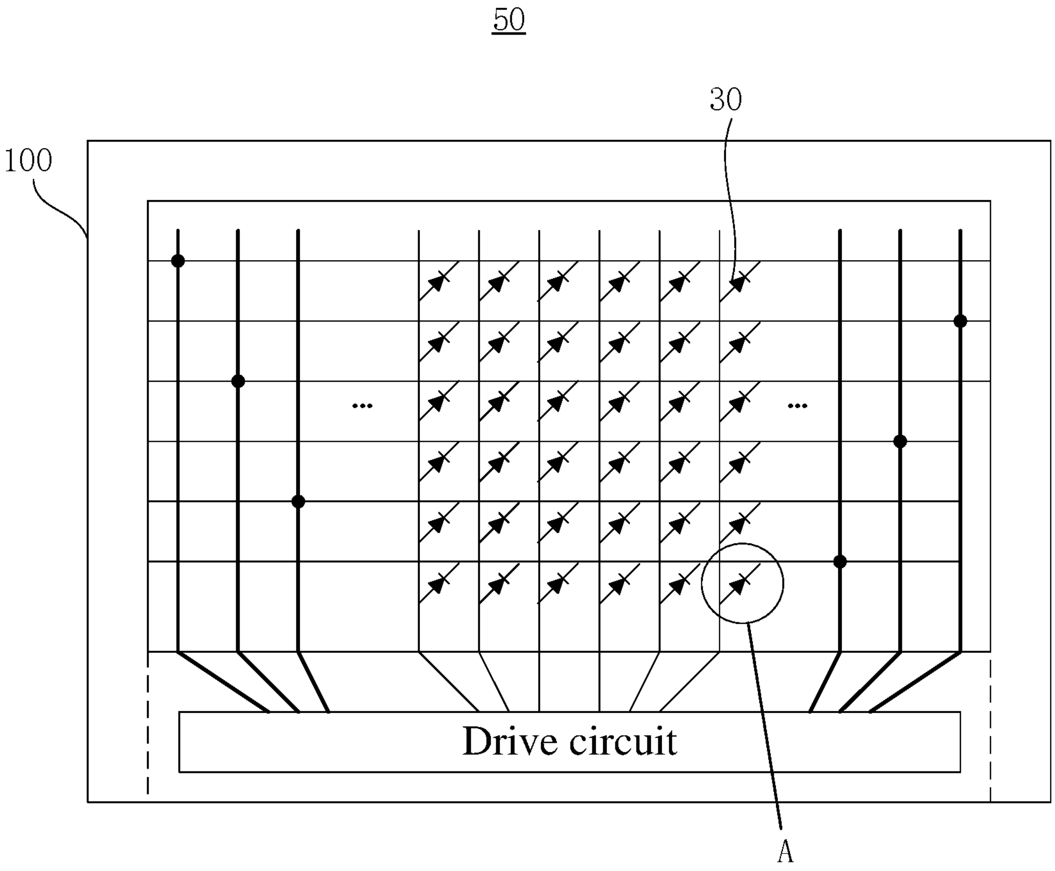
FIG. 2 illustrates a schematic plan view of a display device according to an embodiment of the present disclosure.

Referring to FIGS. 1 and 2, an embodiment of the present disclosure provides a display device 50. The display device 50 provided by the embodiment of the present disclosure can be, for example, a micro LED display device such as a micron LED display device and a mini-LED display device. The display device 50 includes, for example, a driving panel 10 and light emitting devices 30. The light emitting devices 30 are disposed on the driving panel 10 and electrically connected to the driving panel 10. Each of the light emitting devices 30 is, for example, a micro-LED. The micro-LED usually refers to a semiconductor LED chip whose length, width, and thickness are each less than 100 microns (μm), which includes, for example, a micron LED or a submillimeter LED (mini-LED), and even other similar light-emitting device.

In an embodiment, the display device 50 further includes an encapsulation layer 40, for example. For example, the encapsulation layer 40 covers the light emitting devices 30 and the driving panel 10. The encapsulation layer 40 can fix the positions of light emitting devices such as micro LEDs and/or light emitting device circuits, such as micro integrated circuits (ICs), and can play a protective role therefor. The encapsulation layer 40 may be made of epoxy resin, a silicone resin material, and the other materials.

In an embodiment, the display device 50 is a passive matrix (PM) display device, and correspondingly, the driving panel 10 is a passive driving panel. The driving panel 10 is used to control the light emitting devices 30 to turn on and off, so that the display device 50 can display corresponding pictures.

Figure 3:
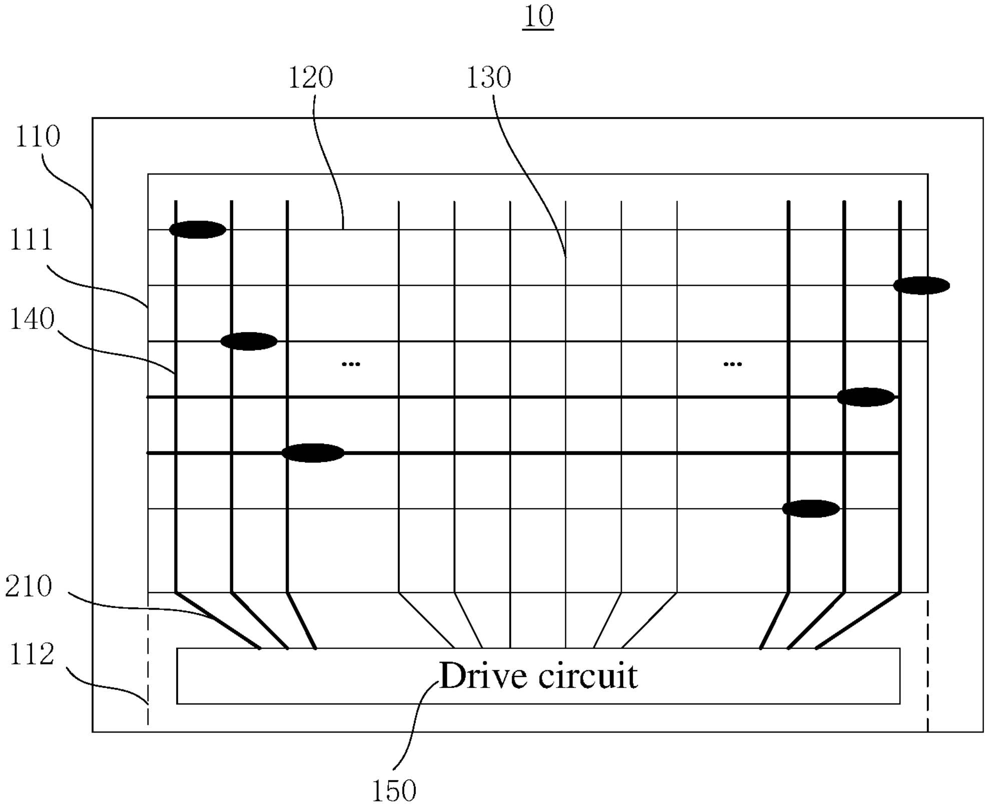
FIG. 3 illustrates a schematic structural view of a driving panel shown in FIG. 2.
Figure 5:
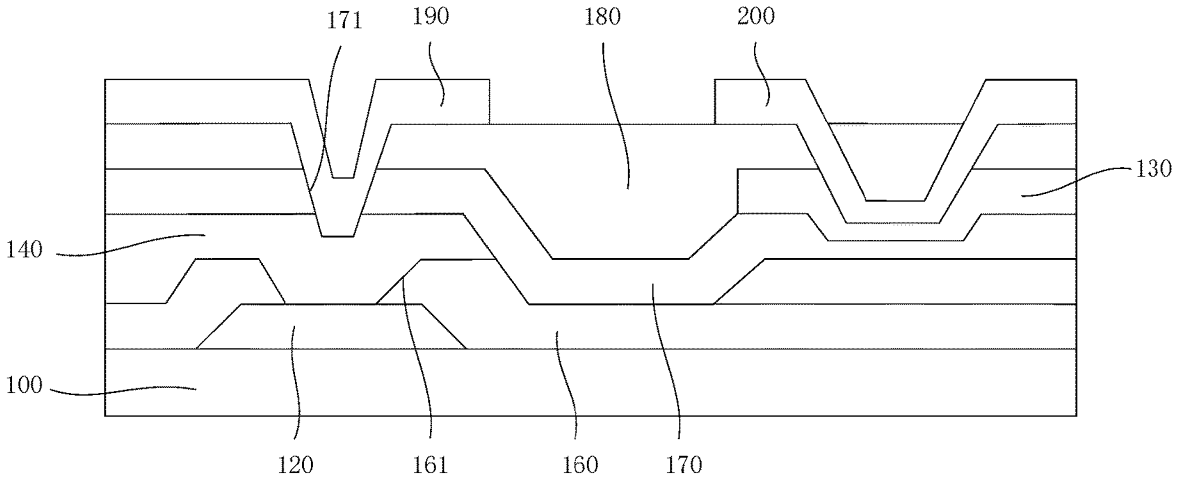
FIG. 5 illustrates a schematic cross-sectional view of the driving panel shown in FIG. 3.
Figure 6:
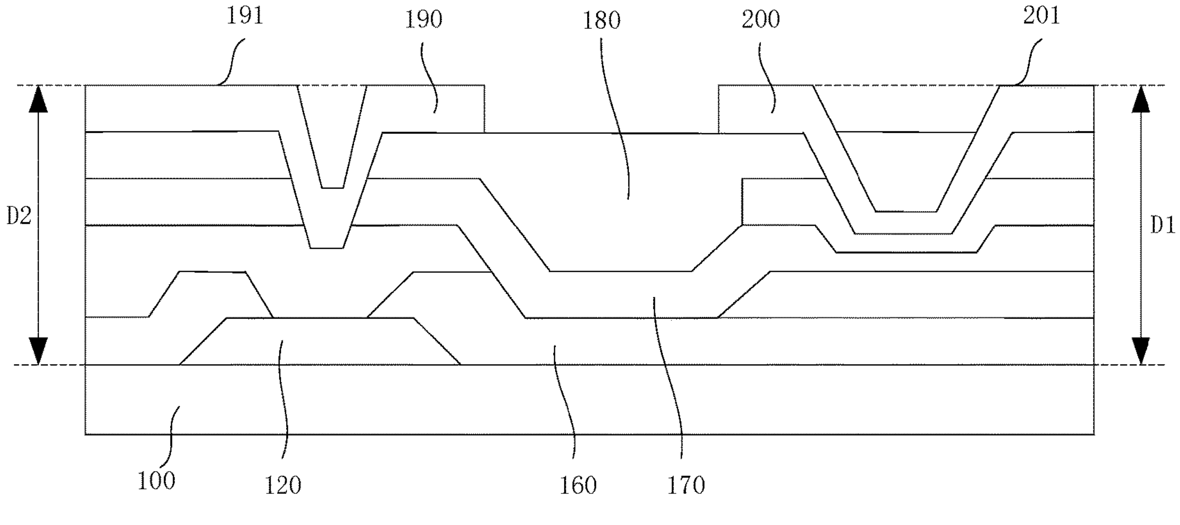
FIG. 6 illustrates a schematic diagram of a positional relationship between electrode pads and a substrate shown in FIG. 5.

In an embodiment, referring to FIG. 3 and FIGS. 5-6, the driving panel 10 includes a substrate 110; and row scanning lines 120, column scanning lines 130, signal connecting lines 140, a drive circuit 150, first electrode pads 200 (only one first electrode pad 200 is shown in the accompanying drawings, but it is apparent that there are more than one first electrode pads), and second electrode pads 190 (only one second electrode pad 190 is shown in the accompanying drawings, but it is apparent that there are more than one second electrode pads) disposed on the substrate 110.

As shown in FIG. 3, the substrate 110 is, for example, a glass substrate. The substrate 110 includes a display area 111 and a non-display area 112. The row scanning lines 120, column scanning lines 130, and signal connecting lines 140 are each disposed in the display area 111. Specifically, as shown in FIG. 3, the column scanning lines 130 are disposed in the display area 111 in a vertical direction (or column direction). The row scanning lines 120 are disposed in a horizontal direction (or row direction) in the display area 111. That is, the row scanning lines 120 and the column scanning lines 130 are alternately (i.e., staggered) disposed in the display area 111. In an embodiment, the row scanning lines 120 and the column scanning lines 130 are disposed perpendicular to each other in the display area 111. The signal connecting lines 140 are disposed in the display area 111, and the signal connection lines 140 are electrically connected to the row scanning lines 120. In an embodiment, the signal connecting lines 140 may be disposed in parallel with the column scanning lines 130. In an embodiment, the signal connecting lines 140 and the row scanning lines 120 are disposed perpendicular to each other in the display area 111. In an embodiment, projections of the signal connecting lines 140 on the substrate 110 may be parallel to, overlap with, or even coincide with projections of the column scanning lines 130 on the substrate 110, which is not limited herein. In an embodiment, projections of the signal connecting lines 140 on the substrate 110 may be parallel to and alternately distributed with projections of the column scanning lines 130 on the substrate 110, that is to say, in the horizontal direction in FIG. 3, every two adjacent signal connecting lines 140 are provided one column scanning line

130 therebetween, and every two adjacent column scanning lines 130 are provided one signal connecting line 140 therebetween. In an embodiment, every two adjacent signal connecting lines 140 are provided with three column scanning lines 130 therebetween. In an embodiment, the projections of the signal connection lines 140 on the substrate 110 are coincide with the projections of the column scanning lines 130 on the substrate 110, that is to say, because the signal connection lines 140 and the column scanning lines 130 are disposed in different layers of the driving panel 10, their projections on the substrate 110 coincide. The signal connection lines 140 are electrically connected to the drive circuit 150, and the row scanning lines 120 are electrically connected to the drive circuit 150 through the signal connection lines 140.

Figure 4:
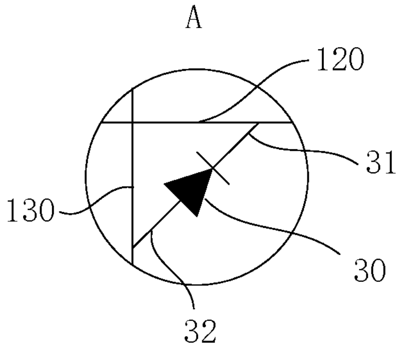
FIG. 4 illustrates a partially enlarged schematic view of an area A in FIG. 2.

The first electrode pads 200 are electrically connected to the column scanning lines 130, and the second electrode pads 190 are electrically connected to the row scanning lines 120 and the signal connection lines 140. The first electrode pad 200 and the second electrode pad 190 are arranged in pairs for connecting one light emitting device 30. The light emitting devices 30 are bonded to the first electrode pads 200 and the second electrode pads 190. Specifically, as shown in FIG. 4, each light emitting device 30 also includes, for example, a first electrode 31 and a second electrode 32 arranged in pairs. For example, the light emitting device 30 is a micro-LED, the first electrode 31 is a cathode (also referred to as an N-pole), and the second electrode 32 is an anode (also referred to as a P-pole). The first electrode 31 is electrically connected to the first electrode pad 200 of the driving panel 10, and the second electrode 32 is electrically connected to the second electrode pad 190 of the driving panel 10. In addition, the light emitting device 30 also includes, for example, a first semiconductor layer, an active layer such as a multi-quantum well layer, and a second semiconductor layer, which are sequentially stacked. The first electrode 31 and the second electrode 32 can be, for example, point metal electrodes or strip metal electrodes, but of course they can also be metal electrodes of other shapes, which is not limited herein. Further, the light-emitting device 30 may be a stacked light-emitting structure formed by sequentially stacking light-emitting elements in the vertical direction and connecting the light-emitting elements in series. In the stacked light emitting structure, a first electrode of one light emitting element of every two adjacent light emitting elements is bonded with a second electrode of the other light emitting element of every two adjacent light emitting elements to form an electrical connection. For example, this bonding is achieved by a metal bonding process. For example, the first electrode and the second electrode are bonded by a pure tin (Sn) layer, a Sn/Aurum (Au) layer, a titanium copper (Ti/Cu) layer, an aluminum nickel gold (Al/Ni/Au) layer or a titanium nickel tin (Ti/Ni/Sn) under heating and pressure. Of course, other bonding connection modes can be adopted between the electrodes of every two adjacent light-emitting elements, as long as there is a light-transmitting area between the light-emitting elements and the light-emitting elements are not completely blocked. Specifically, the light-emitting elements can be, for example, light-emitting elements of the same color, such as all red light-emitting elements, all blue light-emitting elements, all green light-emitting elements, or other light-emitting elements of the same color, thereby integrally forming a monochromatic series high-voltage light-emitting device. Of course, in other embodiments of the present disclosure, the light-emitting elements may have different colors, for example, the light-emitting elements may include red light-emitting elements, green light-emitting elements, and blue light-emitting elements, so that multi-spectral light with three colors of red, green, and blue can be generated, that is to way, a multi-color series high-voltage light-emitting device can be formed as a whole. In this case, in this embodiment, a single pixel adopts a monochromatic series high-voltage light emitting device, such as a monochromatic series high-voltage micro-LED chip, compared with the case of using a single PN structure micro-LED chip as a pixel in the related art, it can reduce a driving current while maintaining a certain brightness, thereby reducing the power consumption of the display device. In addition, the stacked series structure is formed in advance, so that the difficulty of massive transfer will not be increased. Furthermore, since the light-emitting elements in the stacked series structure are sequentially stacked in the vertical direction, the light-emitting elements will not increase the occupied space on the substrates, that is, it will not reduce the resolution pixel per inch (PPI).

In an embodiment, the row scanning lines 120, the column scanning lines 130, the signal connecting lines 140, the first electrode pads 200 and the second electrode pads 190 are respectively arranged on the substrate 110 through at least one of patterning etching, deposition or sputtering processes. The row scanning lines 120, the column scanning lines 130, the signal connection lines 140, the first electrode pad 200, and the second electrode pad 190 are disposed on different layers on the substrate 110. The row scanning lines 120, the column scanning lines 130, the signal connecting lines 140, the first electrode pad 200 and the second electrode pad 190 are transparent conductive lines, and materials thereof are copper or other transparent conductive materials. In addition, the row scanning lines 120, the column scanning lines 130, the signal connecting lines 140, the first electrode pads 200, and the second electrode pads 190 are each at least two in number, as shown in FIGS. 1 and 2.

As mentioned above, since the signal connecting lines are disposed in the display area on the substrate and electrically connected to the row scanning lines, and the row scanning lines are electrically connected to the drive circuit through the signal connecting lines, so that a width of the border of the driving panel can be reduced, so that a small border or even a borderless panel can be realized, and the requirements of more users in the market can be met.

Further, as shown in FIG. 5, the driving panel 10 may further include a first insulating layer 160. The row scanning line 120 is disposed on a side of the substrate 110. The first insulating layer 160 covers the row scanning line 120 and the substrate 110. The signal connection line 140 is formed on the first insulating layer 160. The first insulating layer 160 is provided with a first via 161 (only one first via 161 is shown in FIG. 5, there are at least two first vias 161 in the driving panel 10), such as a through hole, at a position of the first insulating layer 160 adjacent to the row scanning line 120. The signal connection line 140 is electrically connected to the row scanning line 120 through the first via 161. In addition, a material of the first insulating layer 160 may be, for example, silicon oxide, silicon nitride, zirconium oxide, silicon oxynitride, or silicon nitride.

Further, the driving panel 10 further includes, for example, a second insulating layer 170. The second insulating layer 170 covers the signal connection line 140 and the first insulating layer 160. The second insulating layer 170 is located between the second electrode pad 190 and the signal connection line 140. The second insulating layer 170 is provided with a second via 171 (only one second via 171 is shown in FIG. 5, there are at least two second vias 171 in the driving panel 10), and the second electrode pad 190 is electrically connected to the signal connection line 140 through the second via 171. The column scanning line 130 is disposed on the second insulating layer 170. The first electrode pad 200 is electrically connected to the column scanning line 130. In addition, a material of the second insulating layer 170 may be, for example, silicon oxide, silicon nitride, zirconium oxide, silicon oxynitride or silicon nitride.

Further, the driving panel 10 further includes a planarization layer 180. The planarization layer 180 covers the second insulating layer 170 and the column scanning line 130, and the first electrode pad 200 penetrates the planarization layer 180 and is electrically connected to the column scanning line 130. The second electrode pad 190 penetrates the planarization layer 180 and the second insulating layer 170 and is electrically connected to the signal connection line 140. The planarization layer 180 can be any suitable organic material, specifically, acrylic resin, epoxy resin, silicone resin, polyvinyl alcohol, or other suitable material, and more specifically, it can be formed by a suitable process, such as spraying, scraping, spin coating, or dispensing. The planarization layer 180 is used to planarize the second insulating layer 170 and the column scanning line 130, so that the first electrode pad 200 and the second electrode pad 190 have the same height, which is beneficial to the bonding of the light emitting device 30. More specifically, as shown in FIG. 6, the first electrode pad 200 has a first binding surface 201, and the second electrode pad 190 has a second binding surface 191. The first binding surface 201 and the second binding surface 191 are located at a side of the planarization layer 180 facing away from the substrate 100. A minimum distance $D_1$ from the first binding surface 201 to the substrate 100 is equal to a minimum distance $D_2$ from the second binding surface 191 to the substrate 100.

In addition, as shown in FIG. 3, the substrate 100 may further include a non-display area 112 adjacent to the display area 111. The driving panel 10 further includes a drive circuit 150. The drive circuit 150 is disposed in the non-display area 112 of the substrate 100. The column scanning lines 130 and the signal connecting lines 140 are connected to the drive circuit 150. Specifically, the driving panel 10 further includes fan-out lines 210. The fan-out lines are disposed in the non-display area 112. The column scanning lines 130 and the signal connecting lines 140 are connected to the drive circuit 150 through the fan-out lines 210, and the row scanning lines 120 are connected to the drive circuit 150 through the signal connecting lines 140 and the fan-out lines 210. By arranging the fan-out lines 210, an area occupied by the drive circuit 150 on the driving panel 10 can be reduced. The drive circuit 150 is configured to control the display of the light emitting device 30 through the row scanning lines 120 and the column scanning lines 130. The drive circuit 150 can adopt a drive circuit in the related art. Typically, the drive circuit 150 may also include row drive circuits and column drive circuits, which are connected to the row scanning lines 120 and the column scanning lines 130, respectively, and the specific structures thereof will not be described herein.

Figure 7:
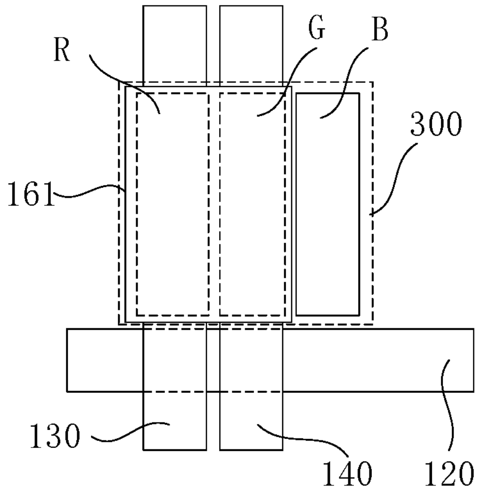
FIG. 7 illustrates a schematic structural diagram of a first via and a pixel unit.

In addition, in other embodiments of the present disclosure, as shown in FIGS. 3 and 7, the row scanning lines 120 and the column scanning lines 130 are at least two in number, the row scanning lines 120 and the column scanning lines 130 are staggered with each other to form pixel units 300 therebetween. Each pixel unit 300 includes, for example, pixels arranged in sequence. In an embodiment, the pixels include a red pixel (R), a green pixel (G) and a blue pixel (B). In other embodiments, each pixel unit 300 includes a red pixel (R), a green pixel (G), a blue pixel (B), a white pixel (W) and the like which are arranged in sequence, and may even include a yellow pixel (Y), which is not limited herein. A projection area of the first via 161 on the substrate 100 is greater than or equal to a projection area of one sub-pixel on the substrate 100. As shown in FIG. 7, a projection area of the first via 161 on the substrate 100 is larger than a projection area of two sub-pixels R and G on the substrate 100.

In summary, the driving panel of the display device provided by the embodiments of the present disclosure can realize a borderless design of the driving panel based on a passive driving mode by arranging the signal connecting lines connecting the row scanning lines in a display area of the driving panel, thereby meeting the requirements of users in the market for narrow borders. In addition, the signal connecting lines are connected to the row scanning lines through each via with an area equal to or larger than that of at least one pixel, so that a current carrying capacity of the signal connecting lines are improved and the reliability of the driving panel is improved. Under the protection of an organic film on the driving panel, the signal connecting lines can be electrically connected to light emitting devices such as micro-LEDs through upper metal pads (first electrode pads and a second electrode pad) on the driving panel. Furthermore, by arranging a planarization layer, the bonding between the upper metal pads and the light emitting devices is facilitated, and the quality and reliability of the driving panel are improved.

It can be understood that the above-mentioned embodiments are merely exemplary explanations of the present disclosure, and technical solutions of the embodiment can be combined and used at will on the premise that the technical features are not conflicting, the structure is not contradictory, and the inventive purpose of the present disclosure is not violated.

Finally, it should be explained that the above embodiments are merely intended to illustrate the technical solutions of the present disclosure, but not intended to limit thereto. Although the present disclosure has been described in detail with reference to the foregoing embodiments, it should be understood by those skilled in the art that it can still modify the technical solutions described in the foregoing embodiments or substitute some technical features with equivalents. However, these modifications or substitutions do not make the essence of the corresponding technical solutions deviate from the spirit and scope of the technical solutions of the embodiments of the present disclosure.

What is claimed is:

1. A driving panel, comprising:

a substrate, comprising a display area and a non-display area;

column scanning lines, disposed in the display area of the substrate;

row scanning lines, disposed in the display area of the substrate and staggered with the column scanning lines;

signal connecting lines, disposed in the display area of the substrate and electrically connected to the row scanning lines;

a drive circuit, disposed in the non-display area of the substrate and electrically connected to the column scanning lines and the signal connecting lines;

first electrode pads, disposed in the display area of the substrate and electrically connected to the column scanning lines;

second electrode pads, disposed in the display area of the substrate and electrically connected to the row scanning lines and the signal connecting lines;

a first insulating layer, wherein the first insulating layer covers the row scanning lines and disposed between the row scanning lines and the signal connecting lines, the first insulating layer is provided with first vias, and the row scanning lines are electrically connected to the signal connecting lines through the first vias; and a second insulating layer, wherein the second insulating layer covers the signal connecting lines and the first insulating layer; the second insulating layer is disposed between the second electrode pads and the signal connecting lines, and also disposed between the first insulating layer and the column scanning lines; and the second insulating layer is provided with second vias, and the second electrode pads are electrically connected to the signal connecting lines through the second vias;

wherein the signal connecting lines are disposed between the first insulating layer and the second insulating layer.

2. The driving panel according to claim 1, further comprising a planarization layer, wherein the planarization layer covers the second insulating layer and the column scanning lines, and the first electrode pads penetrate through the planarization layer and are electrically connected to the column scanning lines.

3. The driving panel according to claim 2, wherein each of the first electrode pads has a first binding surface, and each of the second electrode pads has a second binding surface; the first binding surface and the second binding surface are individually disposed at a side of the planarization layer facing away from the substrate;

and a minimum distance between the first binding surface and the substrate is equal to a minimum distance between the second binding surface and the substrate.

4. The driving panel according to claim 1, wherein the column scanning lines are in parallel with the signal connecting lines, and the column scanning lines and the signal connecting lines are perpendicular to the row scanning lines.

5. The driving panel according to claim 1, wherein every two adjacent signal connecting lines of the signal connecting lines are provided one column scanning line therebetween, and every two adjacent column scanning lines of the column scanning lines are provided one signal connecting line therebetween.

6. The driving panel according to claim 1, wherein every two adjacent signal connecting lines of the signal connecting lines are provided with three column scanning lines therebetween.

7. The driving panel according to claim 1, wherein the signal connecting lines and the column scanning lines are disposed in different layers of the driving panel.

8. The driving panel according to claim 7, wherein the row scanning lines are electrically connected to the drive circuit through the signal connecting lines.

9. The driving panel according to claim 1, wherein the row scanning lines, the column scanning lines, the signal connecting lines, the first electrode pads, and the second electrode pads are disposed on different layers on the substrate.

10. The driving panel according to claim 1, further comprising fan-out lines, wherein the fan-out lines are disposed in the non-display area, the column scanning lines and the signal connecting lines are connected to the drive circuit through the fan-out lines, and the row scanning lines are connected to the drive circuit through the signal connecting lines and the fan-out lines.

11. A display device, comprising:

the driving panel according to claim 1; and light emitting devices, disposed on the driving panel, wherein the light emitting devices comprise first electrodes and second electrodes, the first electrodes are electrically connected to the first electrode pads of the driving panel, and the second electrodes are electrically connected to the second electrode pads of the driving panel.

12. The display device according to claim 11, wherein the row scanning lines and the column scanning lines are staggered with each other to form pixel units therebetween; the light emitting devices are disposed in the pixel units and form sub-pixels; and a projection area of each of the first vias on the substrate is equal to a projection area of at least one of the sub-pixels on the substrate.

13. The display device according to claim 11, wherein each of the light emitting devices is a micron light emitting diode (micro-LED) or a submillimeter LED (mini-LED).

14. The display device according to claim 11, further comprising an encapsulation layer covering the light emitting devices and the driving panel.

15. The display device according to claim 11, wherein the display device is a passive matrix (PM) display device, and the driving panel is a passive driving panel.

16. A passive driving panel, comprising:

a substrate, comprising a display area and a non-display area adjacent to the display area;

column scanning lines, disposed in the display area of the substrate;

row scanning lines, disposed in the display area of the substrate, wherein the row scanning lines are staggered with the column scanning lines and are perpendicular to the column scanning lines;

signal connecting lines, disposed in the display area of the substrate and electrically connected to the row scanning lines;

a drive circuit, disposed in the non-display area of the substrate and electrically connected to the column scanning lines and the signal connecting lines, wherein the row scanning lines are electrically connected to the drive circuit through the signal connecting lines;

first electrode pads, disposed in the display area of the substrate and electrically connected to the column scanning lines;

second electrode pads, disposed in the display area of the substrate and electrically connected to the row scanning lines and the signal connecting lines;

a first insulating layer, wherein the first insulating layer covers the row scanning lines and disposed between the row scanning lines and the signal connecting lines, the first insulating layer is provided with first vias, and the row scanning lines are electrically connected to the signal connecting lines through the first vias; and a second insulating layer, wherein the second insulating layer covers the signal connecting lines and the first insulating layer; the second insulating layer is disposed between the second electrode pads and the signal connecting lines, and also disposed between the first insulating layer and the column scanning lines; and the second insulating layer is provided with second vias, and the second electrode pads are electrically connected to the signal connecting lines through the second vias;

wherein the signal connecting lines are disposed between the first insulating layer and the second insulating layer, and each of the first vias is disposed directly below a corresponding one of the second vias in a direction perpendicular to the substrate.

17. The passive driving panel according to claim 16, wherein each of the first electrode pads has a first binding surface, and each of the second electrode pads has a second binding surface; and a minimum distance between the first binding surface and the substrate is equal to a minimum distance between the second binding surface and the substrate.

* * * * *